United States Patent
Berauer

(10) Patent No.: US 8,735,840 B2
(45) Date of Patent: May 27, 2014

(54) SOLID-BODY X-RAY IMAGE DETECTOR WITH CIRCULAR DETECTOR SURFACE AREA

(75) Inventor: Peter Berauer, Nuremberg (DE)

(73) Assignee: Ziehm Imaging GmbH, Nuremberg (DE)

( * ) Notice: Subject to any disclaimer, the term of this patent is extended or adjusted under 35 U.S.C. 154(b) by 309 days.

(21) Appl. No.: 13/101,433

(22) Filed: May 5, 2011

(65) Prior Publication Data
US 2011/0297839 A1    Dec. 8, 2011

(30) Foreign Application Priority Data
May 5, 2010    (DE) .......................... 10 2010 019 439

(51) Int. Cl.
  *G01T 1/20*        (2006.01)
  *H01L 21/00*    (2006.01)
  *H01L 27/146*    (2006.01)

(52) U.S. Cl.
  CPC ......... *G01T 1/2018* (2013.01); *H01L 27/14627* (2013.01)
  USPC ............... 250/370.11; 257/E31.129; 438/69

(58) Field of Classification Search
  CPC .................. G01T 1/2018; H01L 27/14627
  USPC ............... 250/370.11; 257/E31.129; 438/69
  See application file for complete search history.

(56) References Cited

U.S. PATENT DOCUMENTS

| | | | | |
|---|---|---|---|---|
| 5,528,043 | A | * | 6/1996 | Spivey et al. ............ 250/370.09 |
| 2007/0134906 | A1 | * | 6/2007 | Nygard ......................... 438/618 |
| 2009/0045346 | A1 | * | 2/2009 | Von Kanel et al. ...... 250/370.09 |
| 2009/0224165 | A1 | * | 9/2009 | Mori et al. ............... 250/370.11 |

* cited by examiner

*Primary Examiner* — David Porta
*Assistant Examiner* — Gisselle Gutierrez
(74) *Attorney, Agent, or Firm* — Knobbe, Martens, Olson & Bear LLP

(57) ABSTRACT

A solid-body X-ray image detector and method of manufacturing the same are disclosed. The detector has a circular surface area arrangement of CCD or CMOS detector pixels on a substrate, a scintillator arranged on the substrate, and a circular detector surface area, wherein the substrate comprises a single, substantially circular silicon wafer and the detector surface area takes up the surface area of the silicon wafer up to a narrow edge region.

13 Claims, 3 Drawing Sheets

SOLID-BODY X-RAY IMAGE DETECTOR WITH CIRCULAR DETECTOR SURFACE AREA

CROSS-REFERENCE TO RELATED APPLICATIONS

This application claims the benefit of priority of German Patent Application No. DE102010019439, filed on May 5, 2010, which is hereby incorporated by reference in its entirety.

FIELD OF THE INVENTION

The invention relates to a solid-body X-ray image detector with a circular detector surface area.

BACKGROUND AND SUMMARY OF THE INVENTION

In radiography, X-ray image detectors with round detector surface areas are widely used. These predominately involve X-ray image intensifiers whose output screen is captured with a camera.

An X-ray diagnostic device with an X-ray image intensifier chain is disclosed in DE9755764C2, in which it is provided to display the round camera image on a monitor. The display can be rotated about the center of the image by a user.

An X-ray diagnostic device with an X-ray image intensifier chain is disclosed in DE4224615B4, in which it is provided to achieve the rotation of the round camera image such that the camera is rotated, controlled by a motor. The display of the rotated image can be displayed without image-processing procedures on an image-processing computer.

Conventional X-ray image intensifiers have circular inlet windows with a radiation-sensitive circular surface area of, for example, 213 mm (9-inch image intensifier) or 293 mm (12-inch image intensifier) and a greatly reduced output image.

For many reasons, there is the desire to equip radiography installations, which were earlier equipped with an X-ray image intensifier, with a solid-body X-ray image detector. The reasons include, for example, a lower installation volume, the insensitivity relative to external magnetic fields, and the lack of geometric distortion, like the curvature of the image field occurring in the edge region in image intensifiers.

In one aspect, the present disclosure provides a solid-body X-ray image detector. The detector comprises a substrate comprising a single, uncut, substantially circular silicon wafer made from crystalline silicon, a plurality of detectors on the substrate, and a scintillator arranged on the substrate. A circular detector surface area includes the surface area of the substrate, excluding a narrow edge region.

In one embodiment, the substrate includes a two-dimensional sensor fabricated using charged-coupled device (CCD) or complementary metal-oxide semiconductor (CMOS) technology. In another embodiment, the plurality of detector pixels are located adjacent to a semi-circular, ring-shaped read-out region adjacent to the silicon wafer.

In another embodiment, the diameter of the detector surface area is about 195 mm. In other embodiments, the detector surface area may be about 295 mm in diameter.

In certain embodiments, the plurality of detector pixels substantially cover the circular detector surface area. In another embodiment, the narrow edge region surrounding the circular detector surface area measures about 5 mm in the radial direction.

According to another aspect, the present disclosure provides a method for manufacturing a solid-body X-ray image detector. The method comprises providing a single, uncut, substantially circular silicon wafer made from crystalline silicon, arranging a plurality of detector pixels on the wafer, and depositing a scintillator over the plurality of detector pixels. In one embodiment, arranging the plurality of detector pixels comprises arranging a two-dimensional sensor fabricated using CCD or CMOS technology. In another embodiment, a semi-circular, ring-shaped read-out region is arranged adjacent to the silicon wafer in the radial direction.

In some embodiments, the silicon wafer is about 200 mm in diameter. In other embodiments, the silicon wafer is about 300 mm in diameter.

In another embodiment, the plurality of detector pixels substantially covers the wafer. In some embodiments, the plurality of detector pixels cover the entire first side of the wafer except for a narrow edge region. In certain embodiments, the narrow edge region measures about 5 mm in the radial direction.

DETAILED DESCRIPTION OF THE PREFERRED EMBODIMENT

Detectors with a sandwich made from a scintillator and a photodiode array may be used as a solid-body X-ray image detector. In this configuration, a fiber-optic plate is often arranged between these components as a carrier for the scintillator.

The photodiode array may be integrated in a two-dimensional CCD or CMOS sensor. As the starting material for the two-dimensional sensors, wafers made from crystalline silicon may be used with a wafer diameter of 200 mm or 300 mm. On the market, there are rectangular two-dimensional sensors cut out from processed wafers, wherein the segments that have been cut away are usually not further processed, but instead are disposed of as processing waste. Because the size requirements of solid-body X-ray image detectors usually cannot be met with the available sizes of two-dimensional sensors, a larger detector surface area made of several detector tiles that can be put together on three sides, as disclosed in DE10359430A1. In such an arrangement of detector tiles, through deposition of the scintillator, a solid-body X-ray image detector may be created from which a circular detector surface area is removed.

Figure 1:
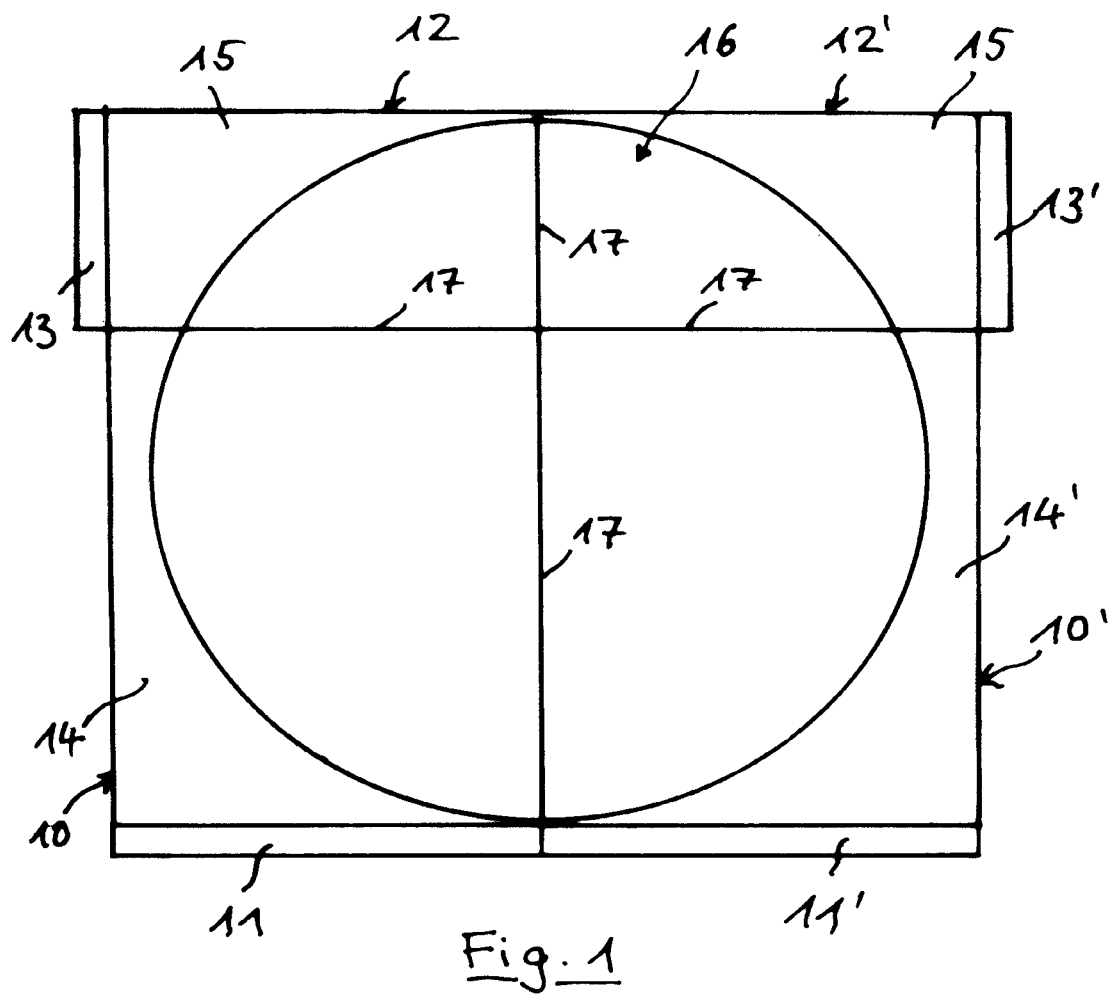
FIG. 1 is a schematic view of a conventional solid-body X-ray image detector assembled from detector tiles.

This configuration is shown schematically in FIG. 1. An arrangement of two first detector tiles (10, 10') that can be put together on three sides and two second detector tiles (12, 12') that can similarly be put together on three sides has, on the outside, read-out regions (11, 11') of the first detector tiles (10, 10') and read-out regions (13, 13') of the second detector tiles (12, 12'). If one starts from a size of the detector surface area (14, 14') of the first detector tiles (10, 10') of 145 mm×115 mm and from a size of the detector surface area (15, 15') of the second detector tiles (12, 12'), like those typically obtained from 200 mm silicon wafers, then with four tiles, an active detector surface area of a total of 230 mm by 210 mm may be achieved from which a circular detector surface area (16) with a diameter of a maximum 210 mm may be removed.

From each 200 mm silicon wafer, one may obtain a first detector tile (10) and two second detector tiles (12). Consequently, for the realization of a circular detector surface area (16) of a maximum 210 mm diameter, three 200 mm silicon wafers are needed as starting material. In addition, a significant amount of assembly effort is required for the assembly and fixing of the detector tiles (10, 10', 12, 12'). Furthermore, the circular detector surface area (16) contains joints (17) that must be corrected by means of image processing after an image capture and for which measures must be taken to reduce the risk of breakage, for example, in the case of impact loading or due to fluctuating thermal loading.

In one embodiment, the objective of the invention is to create, in comparison with conventional solid-body X-ray image detectors, an advantageous, robust, solid-body X-ray image detector that can be produced economically with a circular detector.

This objective may be achieved with a solid-body X-ray image detector having a photodiode array as a two-dimensional CCD or CMOS sensor on a single, uncut silicon wafer as a starting material on which a scintillator is deposited for conversion of the incident X-ray radiation into visible light.

The invention, according to one embodiment, will be explained with reference to FIGS. 2 and 3.

Figure 2:
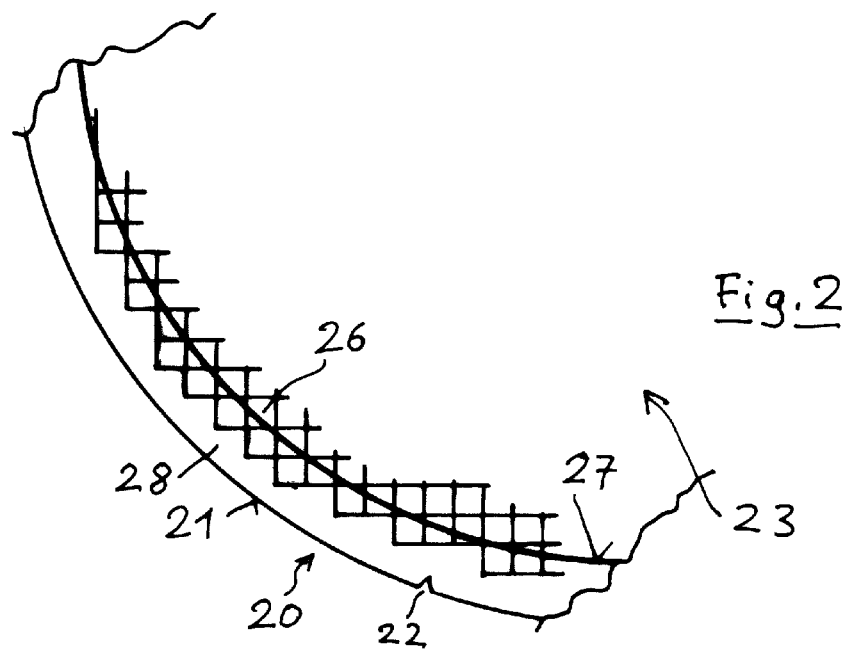
FIG. 2 is a schematic view of an edge region of the solid-body X-ray image detector according to one embodiment of the invention.

In FIG. 2, a part of a silicon wafer (20) used according to one embodiment of the invention is shown schematically with a wafer edge (21), an index mark (22) and an arrangement of detector pixels (26). A circular detector surface area (23) is bounded by an edge border (27). After the solid-body X-ray image detector is installed in an X-ray diagnostic device, the edge border (27) may coincide with the edge of the useful X-ray beam. A narrow edge region (28) that cannot be used as the active detector surface area, because it has gaps in the grid of detector pixels (26), lies adjacent to the circular detector surface area (23) in the radial direction.

The detector pixels (26) may be advantageously arranged in rows on the silicon wafer (20) within the circular detector surface area (23) and the rows may be adjacent at the wafer edge (21) to a read-out region (not shown).

Figure 3:
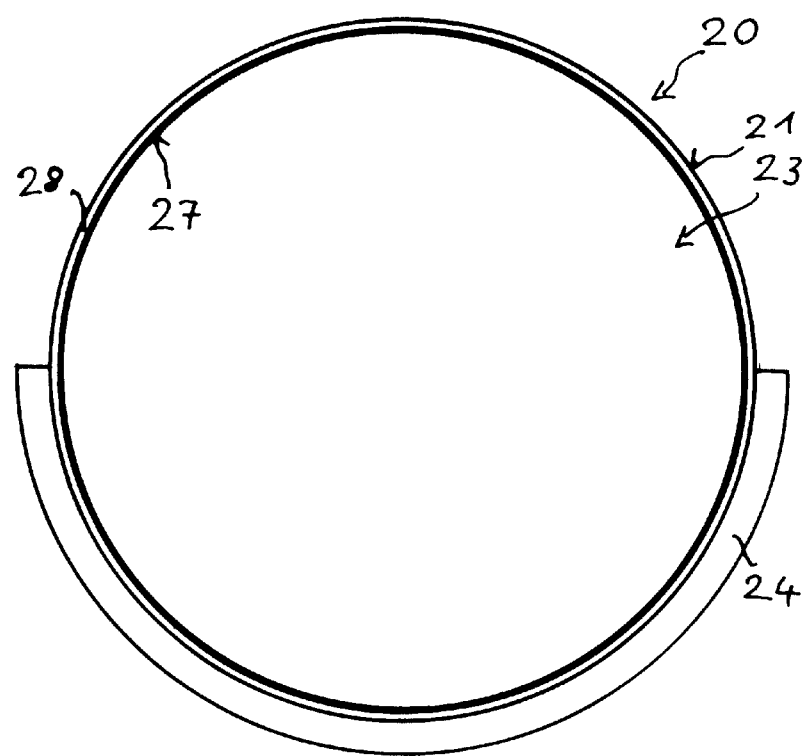
FIG. 3 is a schematic view of a circulator detector surface area with an adjacent semi-circular read-out region.

In FIG. 3, the silicon wafer (20) is illustrated with a semi-circular, ring-shaped read-out region (24) that is adjacent to the silicon wafer (20) in the radial direction and to which the pixel rows are adjacent.

If one starts with a single silicon wafer with a diameter of 200 mm, then in this way a solid-body X-ray image detector could be realized with a circular detector surface area (23) of 195 mm. For the use of a single silicon wafer with a diameter of 300 mm, a solid-body X-ray image detector could be realized with a circular detector surface area (23) of 295 mm, thus, the size of the inlet window of a 12-inch X-ray image intensifier.

Using a single silicon wafer (20) as the basis for constructing the circular detector surface area (23) results in numerous advantages over the tiling technique discussed above. First, the use of a single silicon wafer (20) as the basis for the circular detector surface area (23) may lead to savings of expensive crystalline silicon wafer (20), in comparison with the tiling technique, by, in part, more than 50%. Furthermore, in comparison with the tiling technique, the costs for the assembly and fixing of the detector tiles (10, 10', 12, 12') are eliminated. Additionally, in the case of a solid-body X-ray image detector with a single silicon wafer (20), the mechanical stability may be increased in comparison to the tiling technique.

Although the foregoing description of the preferred embodiments of the present invention has shown, described, and pointed out the fundamental novel features of the invention, it will be understood that various omissions, substitutions, and changes in the form of the detail of the invention as illustrated as well as the uses thereof, may be made by those skilled in the art, without departing from the spirit of the invention.

What is claimed is:

1. A solid-body X-ray image detector comprising:
   a substrate comprising a single, uncut, substantially circular silicon wafer made from crystalline silicon, the substrate having a surface area;
   a plurality of detector pixels on the substrate, the detector pixels adjacent to a semi-circular, ring-shaped read-out region adjacent to the silicon wafer in the radial direction; and
   a scintillator arranged on the substrate;
   wherein the surface area of the substrate, excluding a narrow edge region, comprises a circular detector surface area.

2. The solid-body X-ray image detector of claim 1, wherein the substrate includes a two-dimensional sensor fabricated using CCD or CMOS technology.

3. The solid-body X-ray image detector of claim 1, wherein a surface area of the detector is about 195 mm in diameter.

4. The solid-body X-ray image detector of claim 1, wherein the surface area of the detector is about 295 mm in diameter.

5. The solid-body X-ray image detector of claim 1, wherein the plurality of detector pixels substantially covers the circular detector surface area.

6. The solid-body X-ray image detector of claim 1, wherein the narrow edge region is about 5 mm in the radial direction.

7. A method for manufacturing a solid-body X-ray image detector, the method comprising:
   providing a single, uncut, substantially circular silicon wafer made from crystalline silicon, the wafer having a first side;
   arranging a plurality of detector pixels on the first side of the wafer;
   depositing a scintillator over the plurality of detector pixels; and
   arranging a semi-circular, ring-shaped read-out region adjacent to the silicon wafer in the radial direction.

8. The method of claim 7, wherein arranging a plurality of detector pixels comprises arranging a two-dimensional sensor fabricated using CCD or CMOS technology.

9. The method of claim 7, wherein providing the silicon wafer is about 200 mm in diameter.

10. The method of claim 7, wherein the silicon wafer is about 300 mm in diameter.

11. The method of claim 7, wherein arranging a plurality of detector pixels comprises arranging an array of detector pixels substantially covering the first side of the wafer.

12. The method of claim 11, wherein arranging the plurality of detector pixels comprises arranging an array of detector pixels covering the entire first side of the wafer except for a narrow edge region.

13. The method of claim 12, wherein the edge region is about 5 mm in the radial direction.

* * * * *

UNITED STATES PATENT AND TRADEMARK OFFICE
CERTIFICATE OF CORRECTION

| | |
|---|---|
| PATENT NO. | : 8,735,840 B2 |
| APPLICATION NO. | : 13/101433 |
| DATED | : May 27, 2014 |
| INVENTOR(S) | : Berauer |

It is certified that error appears in the above-identified patent and that said Letters Patent is hereby corrected as shown below:

In the Claims

Column 4, Lines 59-60, Claim 12, please delete "a narrow edge" and insert therefore, --an edge--.

Signed and Sealed this
Sixteenth Day of December, 2014

Michelle K. Lee
*Deputy Director of the United States Patent and Trademark Office*